United States Patent
Chan et al.

[11] Patent Number: 5,870,330
[45] Date of Patent: Feb. 9, 1999

[54] METHOD OF MAKING AND STRUCTURE OF SRAM STORAGE CELL WITH N CHANNEL THIN FILM TRANSISTOR LOAD DEVICES

[75] Inventors: Tsiu Chiu Chan; Loi N. Nguyen, both of Carrollton, Tex.

[73] Assignee: STMicroelectronics, Inc., Carrollton, Tex.

[21] Appl. No.: 774,911

[22] Filed: Dec. 27, 1996

[51] Int. Cl.[6] .................................................. G11C 11/00
[52] U.S. Cl. .......................... 365/154; 365/156; 257/903; 257/904
[58] Field of Search ..................... 365/154, 156; 257/903, 904, 368, 369

[56] References Cited

U.S. PATENT DOCUMENTS

| | | |
|---|---|---|
| 4,797,717 | 1/1989 | Ishibashi et al. ............... 357/23.1 |
| 5,135,888 | 8/1992 | Chan et al. ..................... 437/186 |
| 5,159,416 | 10/1992 | Kudoh ........................... 357/23.7 |
| 5,187,114 | 2/1993 | Chan et al. ..................... 437/52 |
| 5,196,233 | 3/1993 | Chan et al. ..................... 437/186 |
| 5,521,861 | 5/1996 | Lee ............................... 365/156 |
| 5,526,304 | 6/1996 | Kawamura ....................... 365/154 |
| 5,535,155 | 7/1996 | Abe ............................... 365/154 |
| 5,635,731 | 6/1997 | Ashida ............................ 257/67 |

*Primary Examiner*—Son Mai
*Attorney, Agent, or Firm*—Theodore E. Galanthay; Lisa K. Jorgenson; Andre M. Szuwalski

[57] ABSTRACT

An SRAM cell includes a pair of N channel transistors acting as inverting circuits, a pair of N channel transistors which perform the control function for the cell, and a pair of N channel thin film transistors in depletion mode with gate and source shorted to provide load devices for the N channel inverter transistors of the SRAM cell.

14 Claims, 4 Drawing Sheets

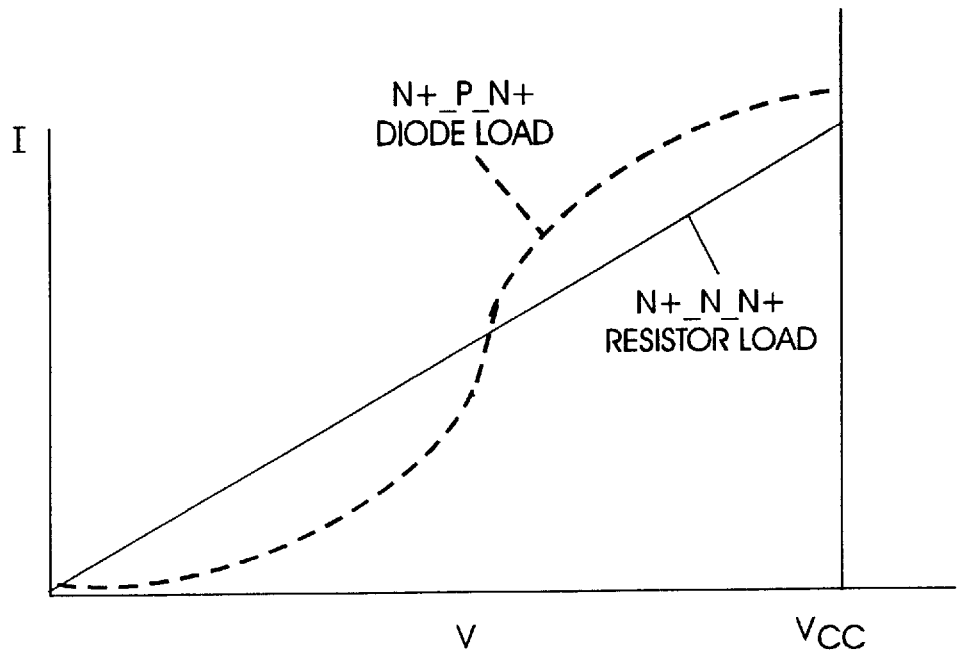
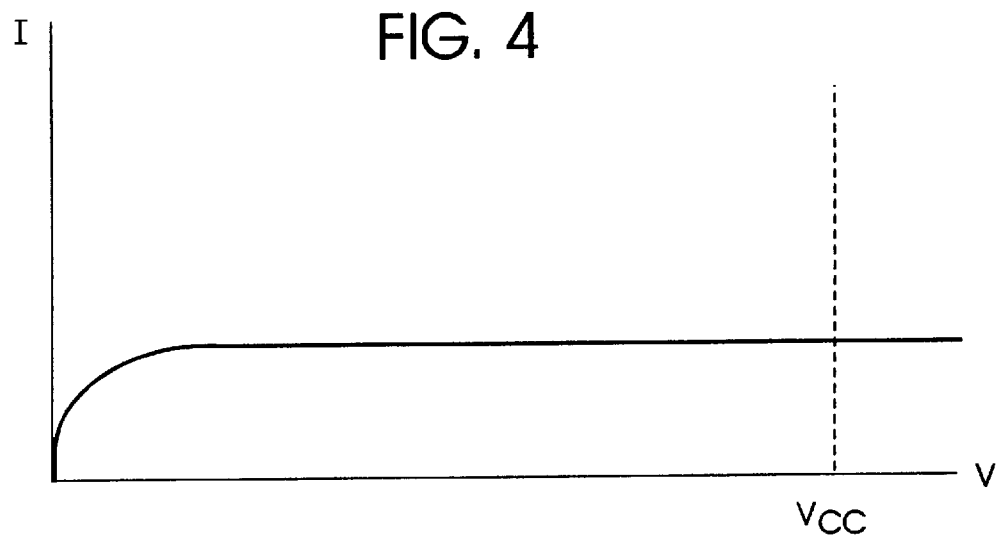

METHOD OF MAKING AND STRUCTURE OF SRAM STORAGE CELL WITH N CHANNEL THIN FILM TRANSISTOR LOAD DEVICES

BACKGROUND OF THE INVENTION

1. Field of the Invention

The present invention relates to semiconductor integrated circuit structures and methods of making such structures and, more particularly, to method of making and structure of an SRAM cell having N channel depletion TFT load devices.

2. Prior Art

CMOS static RAM access memories (SRAM) are used in the semiconductor and computer industries as a result of the combination of speed, low power, and no requirement for refresh. Information can be written into and read out of an SRAM cell faster than with a DRAM cell, because the transistors of the SRAM cell can be switched faster than capacitors can be charged and drained. However, a disadvantage of prior art SRAM cells is that such cells have required a larger footprint to achieve greater speed and stability than DRAM cells.

An SRAM cell can be formed using cross-coupled CMOS inverters having two N channel transistors and two P channel transistors. Typically, the cell is accessed by two N channel control gates for a standard SRAM cell and four control gates for two port memory devices.

There have been many attempts to improve SRAM cells by replacing the P channel transistors with other devices. For example, in some cases, the P channel transistors are replaced with poly silicon resistance back-to-back diodes as resistive load devices. However, the resistance of the back-to-back diode increases significantly at lower voltages and lower temperatures. For example, resistance might be ten times higher at 0° C. as compared to 80° C.

Further, a major single bit failure which has occurred during functional testing of SRAM cells is data retention at low voltage at low temperature. These single bit failures occur when the amount of leakage current at the storage node exceeds the amount of current that can be supplied by the back-to-back diode resistance during low voltage and cold temperature.

One attempt to solve the problem has been to reduce the overall resistance value of the back-to-back diode. However, when the load resistance of a cell is decreased, the amount of standby current is significantly increased, thus increasing power dissipation in the cell.

Another prior art approach has been to employ poly silicon resistance devices as load devices. Although the voltage dependency is lower than that of the back-to-back resistance diode approach, the temperature dependency still prevails with higher resistance values at low temperature as compared to high temperature resistance.

The P channel MOSFET device provides a low off current and a high on current to sustain leakage of the storage node. However, if the pulldown transistors exhibit high leakage, the Vcc must be electrically disconnected to reduce the standby current. Additionally, for the P channel device, the cell area is much larger than for the other devices described above. Such a cell and the method of making same are taught in U.S. Pat. No. 5,187,114.

Another prior art attempt to solve some of the problems of load devices in SRAM cells has been the use of P channel thin film transistors as the load devices. However, the P channel TFTs are difficult to fabricate with low off current and high on current and further requires the alignment offset of the Drain implant which has a large impact on controlling the on and off current. Further, the P channel TFT has a cell area which is at least 50 percent larger than the back-to-back diode load implementation.

There is a need for an SRAM cell which is relatively immune from voltage variation, which does not require a source/drain offset, which does not require the Vcc line to be disconnected where the pulldown transistors exhibit high leakage current, and which conserves power and energy by controlling current from low Vcc to high Vcc.

SUMMARY OF THE INVENTION

Accordingly, an SRAM cell includes a pair of N channel transistors acting as inverting circuits, a pair of N channel transistors which perform the control function for the cell, and a pair of N channel thin film transistors in depletion mode with gate and source shorted to provide load devices for the N channel inverter transistors of the SRAM cell.

A method for constructing an SRAM cell in accordance with the present invention includes the following steps:

Formation of active and field isolation layer;

Deposition of gate electrode definition and formation of passgate and pulldown transistor;

Deposition of TEOS;

Pattern and etch shared contact 1 (SC1);

Deposition of poly silicon layer 2;

Local interconnect and gate electrode for the N channel TFT;

Implanting phosphorous to desired sheet resistance (rho);

Annealing for predetermined time at predetermined temperature;

Patterning and etching poly silicon layer 2;

Deposition of TEOS at a predetermined thickness to form gate dielectric for the N channel TFT;

Annealing at a predetermined temperature for a predetermined time;

Pattern and etch layer shared contact 2 (SC2);

Deposition of poly silicon layer 3;

Patterning and etching poly silicon layer 3;

Blanketing N channel TFT implant;

Patterning TFT;

Implanting N+ TFT source/drain;

Deposition of dielectric; and

Contact and metal interconnection.

It is an advantage of the present invention that an SRAM cell in accordance with the present invention has virtually no dependency on supply voltage, does not require supply voltage to be electrically disconnected where the pulldown transistors have high leakage current, and where the load devices act as constant current sources within the SRAM cell.

BRIEF DESCRIPTION OF THE DRAWINGS

FIG. 3 is a graphical representation of current against voltage characteristics for prior art SRAM cells.

FIG. 4 is a graphical representation of the current vs. voltage characteristics of an SRAM cell in accordance with the present invention.

DETAILED DESCRIPTION OF A PREFERRED EMBODIMENT OF THE INVENTION

The process steps and structures described herein do not form a complete process flow for manufacturing integrated circuits. The present invention can be practiced in conjunction with integrated circuit fabrication techniques currently used in the prior art, and only so much of the commonly practiced process steps are included as are necessary for an understanding of the present invention. The figures representing cross-sections of portions of an integrated circuit during fabrication are not drawn to scale but instead are drawn so as to illustrate the important features of the invention.

Figure 1:
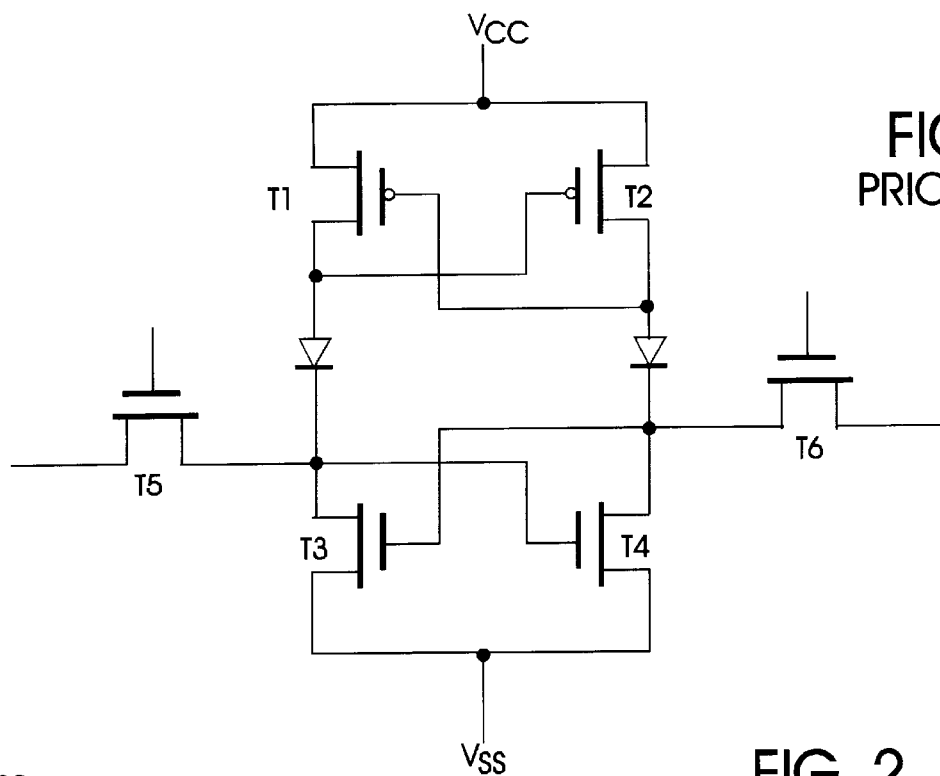
FIG. 1 is a circuit diagram of a prior art SRAM cell employing P channel transistors as load devices.

Referring now to FIG. 1, a prior art SRAM cell is shown where P channel TFT transistors are used as load devices. Transistors T1 and T2 are P channel transistors which serve as load devices for the pulldown transistors T3 and T4, respectively, in the cell. Transistors T5 and T6 are the control transistors of the SRAM cell. The prior art circuit of FIG. 1 is subject to the disadvantages described above in the background of the invention.

Figure 2:
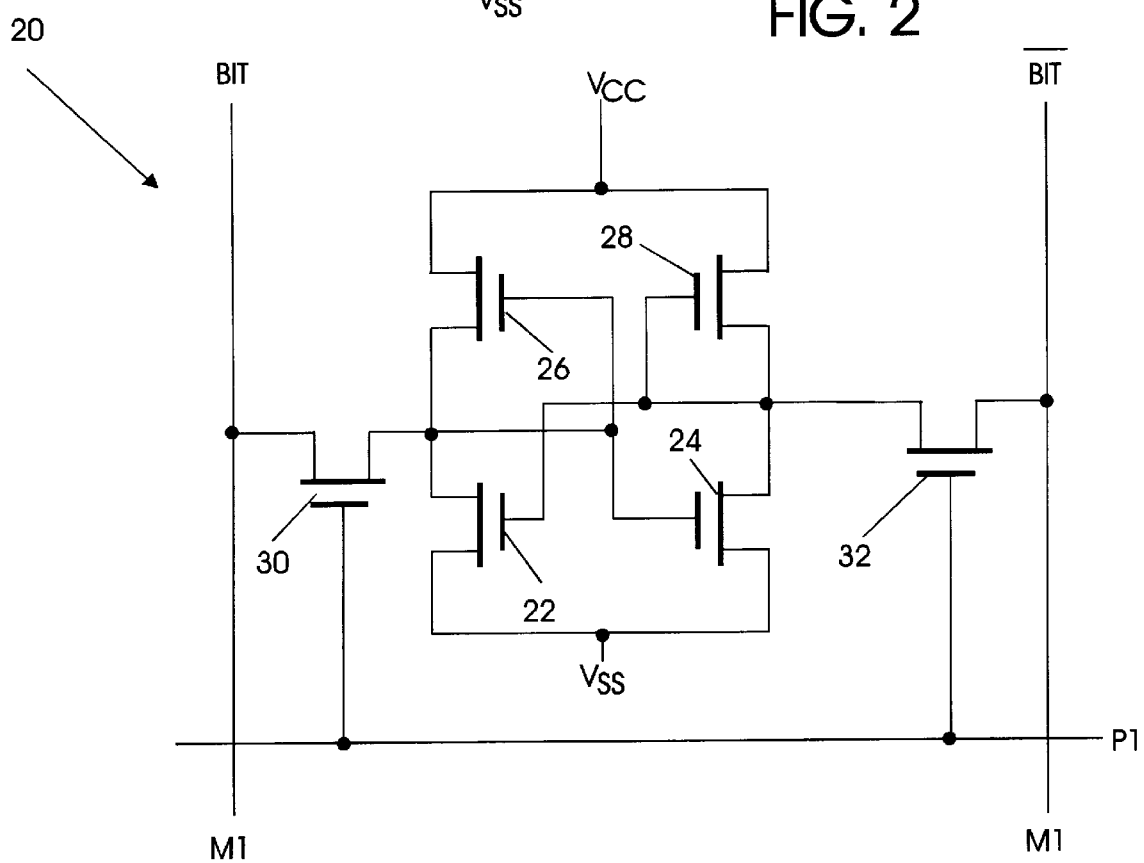
FIG. 2 is a circuit diagram of an SRAM cell in accordance with the present invention.

Referring now to FIG. 2, an SRAM cell 20 embodying the present invention will be described. Cell 20 includes cross-coupled inverters which consist of pulldown transistors 22 and 24 having respective load devices 26 and 28 where pulldown transistors 22 and 24 are N channel devices, and load transistors 26 and 28 are depleted N channel thin film transistors having gate and source connected together. Transistors 30 and 32 are the control transistors which connect the cell to bit and word lines in a memory array 50 (see FIG. 6).

Referring now to FIGS. 3 and 4, the current/voltage characteristics of prior art SRAM cells and an SRAM cell in accordance with the present invention will be discussed. The solid straight line shown in the graphical representation of FIG. 3 represents a resistive load such as might be formed by back-to-back diodes. Note that the current voltage characteristics of the load are linearly variable as Vcc changes.

Similarly, a diode load is shown in the dotted line having a current vs. voltage characteristic which is generally S-shaped. Note that the current is low as voltage increases from 0 to a point where the cell becomes unstable and then current increases more rapidly as the voltage approaches Vcc.

In contrast, FIG. 4 shows the current vs. voltage characteristics of an SRAM cell in accordance with the present invention. After an initial rise in current as voltage rises from 0 to some relatively low value, the amount of current remains relatively constant as Vcc varies from the low voltage to maximum Vcc. This provides a much more stable cell and eliminates voltage dependency in the cell. It also provides the cell with a much smaller current drain than the prior art cells.

Figure 5:
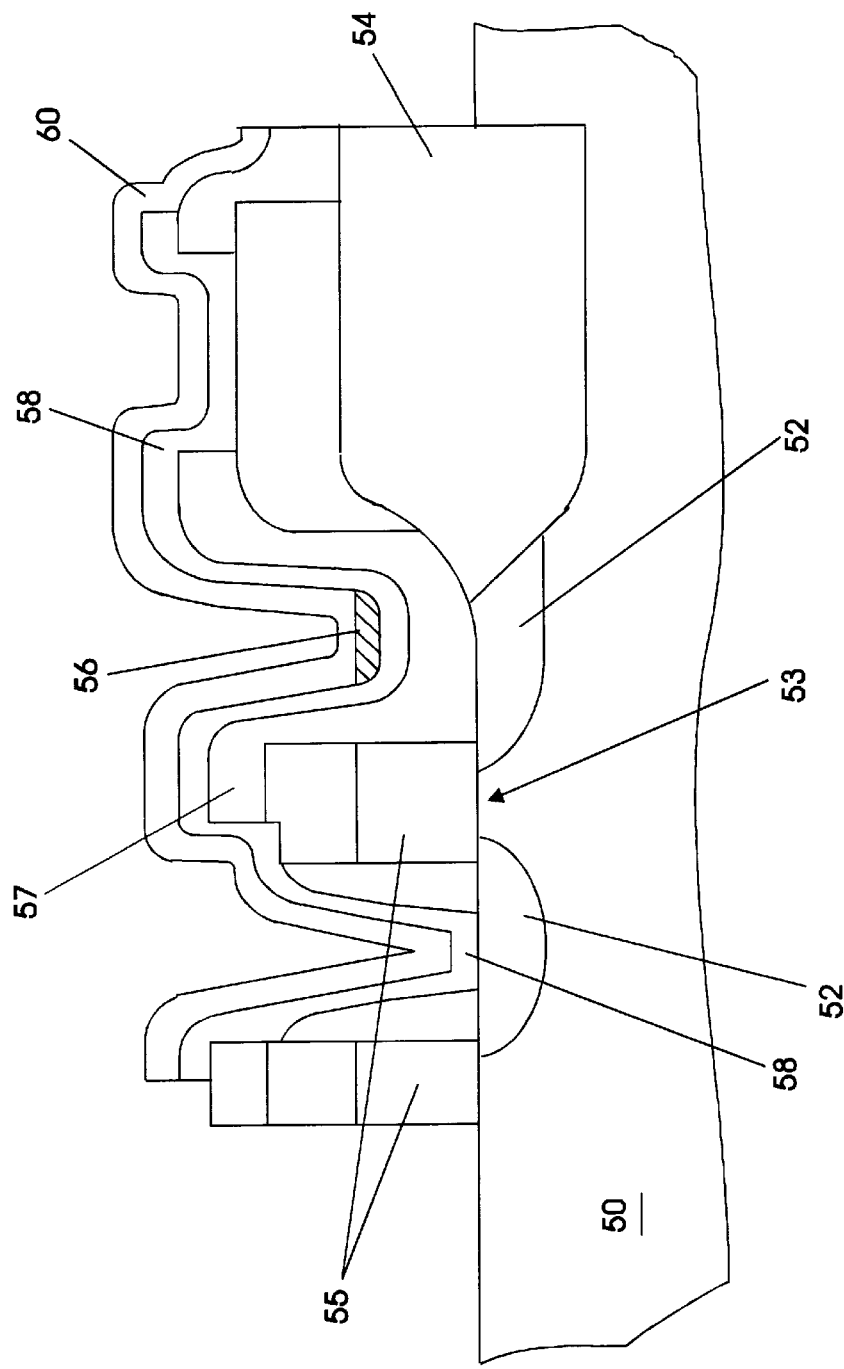
FIG. 5 is a cross-section view of an SRAM cell in accordance with the present invention.

Referring now to FIG. 5, the physical structure and the method of constructing an SRAM cell in accordance with the present invention will be described. Active regions 52 and isolation region 54 are formed on substrate 50. Next, gate oxide 53 and gate electrodes 55 (first polysilicon layer) are deposited. Next, isolation layer 57, TFT gate electrodes 58 and TFT gate oxide 56 are deposited. The source/drain layer 60 is then deposited above the gate electrode 58.

The process for constructing a six-transistor SRAM storage cell using N channel depletion mode transistors as load devices in accordance with the present invention will be described.

The active and field isolation layers are formed. Next, the gate oxide and gate electrode layers are deposited. The transistor definition for the passgate and pulldown transistors, layer crystalline silicon P1 is formed. Next, a layer of TEOS between approximately 1,000 and 2,000 angstroms is deposited. Next, shared contacts 1 (SC1) is patterned and etched. Next, poly crystalline silicon layer P2 is deposited, including the local interconnect and the gate electrode for the N channel TFT. Next, phosphorous is implanted to achieve a desired sheet resistance. Next, the structure is annealed at between approximately 800° C. and 850° C. for approximately 30 minutes.

Next, poly crystalline silicon layer P2 is patterned and etched. Then a layer of TEOS between approximately 200 and 600 angstroms is deposited to form the gate dielectric for the N channel TFT at approximately 800° C. and 850° C. for approximately 30 minutes. Next, layer shared contacts 2 (SC2) is patterned and etched. Poly crystalline silicon layer P3 is deposited and then patterned and etched. Next, the N TFT channel implant is blanketed over the structure with appropriate arsenic or phosphorous belting to achieve a desired drain current. The N+ source/drain layer is patterned, and an appropriate dose of arsenic or phosphorous is implanted into the N+ source/drain layer to achieve the desired drain current. Last, the contact and metal interconnections are made to complete the circuit.

Figure 6:
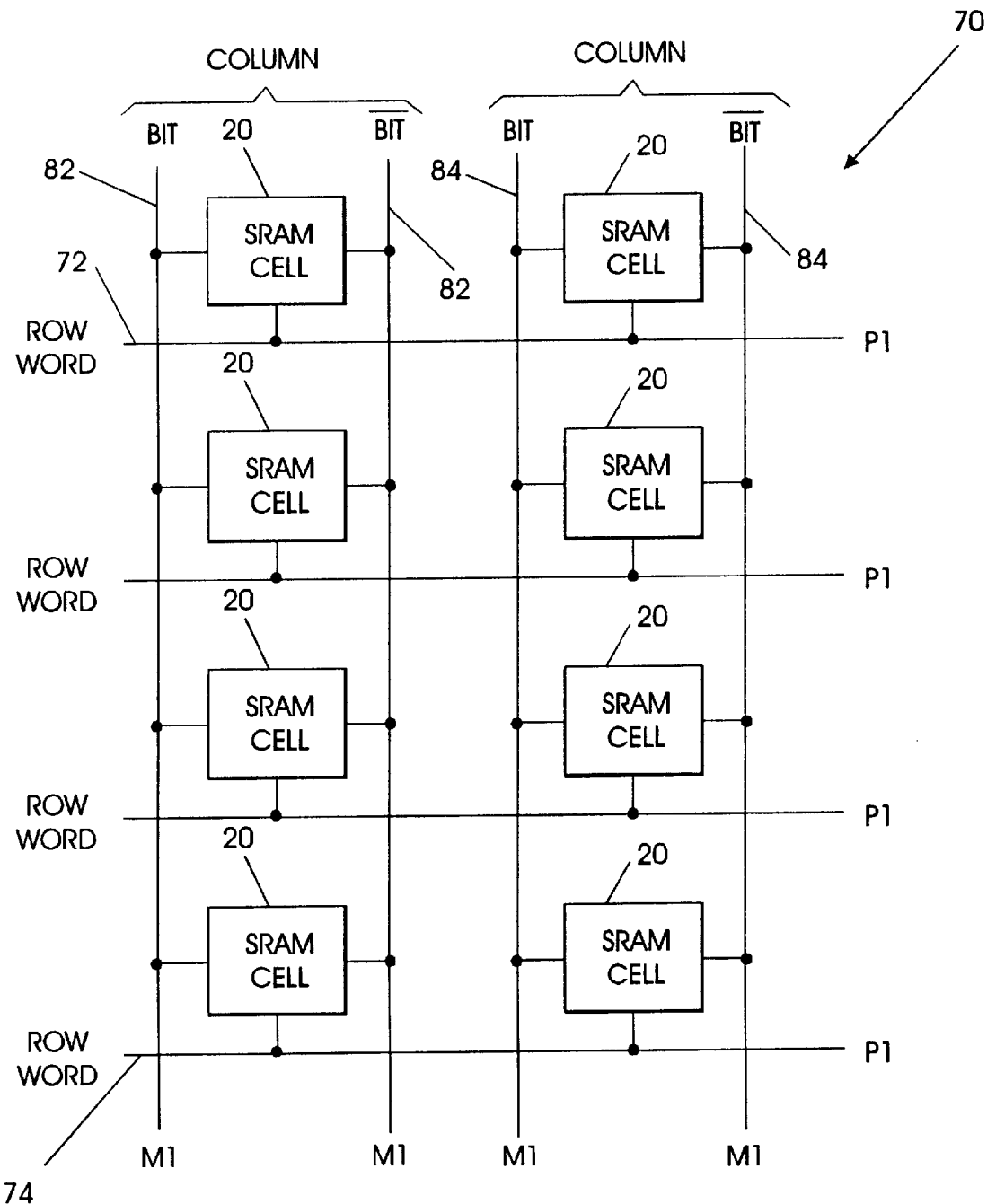
FIG. 6 is a block diagram of an SRAM cell array embodying the present invention.

Referring to FIG. 6, an SRAM cell area embodying the present invention will be described.

Array 70 includes a number of cells 20 (see FIG. 2) arranged in rows and columns. Each cell is connected to a word line 72, . . . 74, and to a pair of bit lines 82, . . . 84.

Although the present invention and its advantages have been described in detail, it should be understood that various changes, substitutions and alterations can be made herein without departing from the spirit or scope of the invention as defined in the appended claims.

What is claimed is:

1. A static random access memory cell, comprising:
   first and second N channel transistors having a first element of each of the transistors connected to a first voltage source;
   a second element of each of the first and second transistors connected to first elements of respective N channel thin film transistors, the first and second transistors having control elements cross-coupled to the second elements of the second and first transistors, respectively; and
   wherein said N channel thin film transistors are configured to be normally turned on and to provide current at a substantially constant level to said first and second N channel transistors.

2. A static random access memory cell, according to claim 1, wherein said second elements of the thin film transistors are connected to a second voltage source, and each of the thin film transistors having a control element connected to said first element of such thin film transistor and to the control element of the opposite second and first transistors, respectively.

3. The static random access memory cell of claim 2, wherein the N channel of each of said thin film transistors is a depletion mode N channel.

4. A static random access memory cell, according to claim 1, further comprising first and second control transistors for connecting the cell to input and output data lines.

5. The static random access memory cell of claim 1, wherein the N channel of each of said thin film transistors is a depletion mode N channel.

6. A static random access memory cell array comprising one or more SRAM memory cells, each such memory cell comprising:
   first and second N channel transistors having a first element of each of the transistors connected to a first voltage source;
   a second element of each of the first and second transistors connected to first elements of respective N channel thin film transistors, the first and second transistors having control elements cross-coupled to the second elements of the second and first transistors, respectively; and
   wherein said N channel thin film transistors are configured to be normally turned on and to provide current at a substantially constant level to said first and second N channel transistors.

7. A static random access memory cell array, according to claim 6, wherein said second elements of the thin film transistors are connected to a second voltage source, and each of the thin film transistors having a control element connected to said first element of such thin film transistor and to the control element of the opposite second and first transistors, respectively.

8. The static random access memory cell array of claim 7, wherein the N channel of each of said thin film transistors is a depletion mode N channel.

9. A static random access memory cell array, according to claim 6, further comprising first and second control transistors for connecting the cell to input and output data lines.

10. The static random access memory cell array of claim 6, wherein the N channel of each of said thin film transistors is a depletion mode N channel.

11. A static random access memory cell, comprising:
   first and second N channel transistors having a first element of each of the transistors connected to a first voltage source;
   a second element of each of the first and second transistors connected to first elements of respective N channel thin film transistors, the first and second transistors having control elements cross-coupled to the second elements of the second and first transistors, respectively;
   a second element of each of said N channel thin film transistors is connected to a second voltage source, and said N channel thin film transistors are configured to be normally on and to provide current which is substantially independent of variation in voltage between said first voltage source and said second voltage source.

12. The memory cell of claim 11, wherein:
   said N channel thin film transistors are depletion mode transistors.

13. The memory cell of claim 11, wherein:
   each of the thin film transistors includes a control element connected to said first element of such thin film transistor and to the control element of the opposite second and first transistors, respectively.

14. The memory cell of claim 13, wherein:
   said N channel thin film transistors are depletion mode transistors.

* * * * *